United States Patent
Wang et al.

(10) Patent No.: US 11,626,571 B2
(45) Date of Patent: Apr. 11, 2023

(54) DISPLAY PANEL, PREPARATION METHOD THEREOF AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qian Wang, Beijing (CN); Shiyang Xu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 111 days.

(21) Appl. No.: 17/181,533

(22) Filed: Feb. 22, 2021

(65) Prior Publication Data

US 2021/0265589 A1 Aug. 26, 2021

(30) Foreign Application Priority Data

Feb. 25, 2020 (CN) .......................... 202010116339.3

(51) Int. Cl.
*H01L 51/52* (2006.01)
*H01L 51/56* (2006.01)

(52) U.S. Cl.
CPC .......... *H01L 51/5237* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| 2019/0157312 A1* | 5/2019 | Lee ........................ H01L 51/52 |
| 2019/0214412 A1 | 7/2019 | Yuan et al. |
| 2020/0161572 A1 | 5/2020 | Zheng et al. |
| 2020/0243785 A1* | 7/2020 | Yin ..................... H01L 51/5256 |
| 2021/0408453 A1* | 12/2021 | Liu ..................... H01L 27/3244 |

FOREIGN PATENT DOCUMENTS

| CN | 109256400 A | 1/2019 | |
| CN | 109686865 A | 4/2019 | |
| CN | 110164939 A | 8/2019 | |
| CN | 110164939 B | * 2/2021 | ............. G09F 9/301 |
| KR | 20190014230 A | 2/2019 | |

OTHER PUBLICATIONS

Machine Translation of CN-110164939 (Year: 2019).*
Chinese Office Action from 202010116339.3 dated Apr. 27, 2022.
Chinese Office Action from 202010116339.3 dated Nov. 9, 2022.

* cited by examiner

*Primary Examiner* — J. E. Schoenholtz

(74) *Attorney, Agent, or Firm* — ArentFox Schiff LLP; Michael Fainberg

(57) ABSTRACT

A display panel, a preparation method thereof and a display device. The display panel has a display area and anon-display area outside the display area. The non-display area includes: a first non-display area close to the display area, a second non-display area located on one side away from the display area, of the first non-display area, and a bent area between the first non-display area and the second non-display area. The bent area includes: a substrate and a first buffer layer located on the substrate. Materials of the first buffer layer include: a first doping element and a first insulation compound. The first doping element is used for improving ductility of the first buffer layer.

15 Claims, 5 Drawing Sheets

DISPLAY PANEL, PREPARATION METHOD THEREOF AND DISPLAY DEVICE

CROSS-REFERENCE TO RELATED APPLICATION

This application is based on and claims priority under 35 U.S.C 119 to Chinese Patent Application No. 202010116339.3, filed on Feb. 25, 2020, in the China National Intellectual Property Administration. The entire disclosure of the above application is incorporated herein by reference.

FIELD

The present disclosure relates to the technical field of displaying, in particular to a display panel, a preparation method thereof and a display device.

BACKGROUND

At present, an OLED (Organic Light-Emitting Diode) display product has the advantages of high screen brightness, wide color gamut, low power consumption, large visual angle and the like, thereby being developed energetically.

SUMMARY

An embodiment of the present disclosure provides a display panel. The display panel has a display area and a non-display area outside the display area. The non-display area includes: a first non-display area close to the display area, a second non-display area located on one side away from the display area, of the first non-display area, and a bent area between the first non-display area and the second non-display area. The bent area includes a substrate and a first buffer layer located on the substrate. Materials of the first buffer layer include: a first doping element and a first insulation compound. The first doping element is used for improving ductility of the first buffer layer.

Optionally, the first doping element includes one or combination of following elements: a molybdenum element, a zinc element, a tin element and a nickel element.

Optionally, an atomic ratio of the first doping element in the first buffer layer is 5% to 6%.

Optionally, the materials of the first buffer layer further include a second doping element; wherein the second doping element is used for improving a thermal insulation property and a water-resisting property of the first buffer layer.

Optionally, the second doping element includes one or combination of following elements: a germanium element, a nickel element and a zinc element.

Optionally, an atomic ratio of the second doping element in the first buffer layer is 5% to 6%.

Optionally, the bent area further includes a lead layer located on the first buffer layer. The first buffer layer and the lead layer extend to the first non-display area and the second non-display area. In the first non-display area and the second non-display area, an insulation layer is further arranged between the first buffer layer and the lead layer. A thickness of the first buffer layer in the first non-display area and the second non-display area is larger than a thickness of the first buffer layer in the bent area.

An embodiment of the present disclosure provides a preparation method of a display panel, including:

providing a substrate, wherein the display panel includes a bent area;

forming a first buffer layer on the substrate, wherein the first buffer layer includes a first doping element and a first insulation compound, and the first doping element is used for improving ductility of the first buffer layer;

forming an insulation layer on the first buffer layer;

removing the insulation layer in the bent area and part of the first buffer layer; and forming a lead layer, wherein the lead layer makes contact with the first buffer layer in the bent area.

Optionally, the first buffer layer further includes a second doping element, and the forming the first buffer layer on the substrate includes:

providing a target material including the first doping element, the second doping element and the first insulation compound, wherein the second doping element is used for improving a thermal insulation property and a water-resisting property of the first buffer layer; and depositing the target material on the substrate through a physical deposition process so as to form the first buffer layer.

Optionally, the forming the insulation layer on the first buffer layer includes:

forming a second buffer layer, a first gate insulation layer, a second gate insulation layer and an interlayer insulation layer on the first buffer layer in sequence.

An embodiment of the present disclosure provides a display device, including the display panel provided by embodiments of the present disclosure.

BRIEF DESCRIPTION OF THE DRAWINGS

In order to make technical solutions in embodiments of the present disclosure clearer, accompanying drawings required for description of the embodiments will be briefly introduced as follows, notably, the accompanying drawings in the following description only illustrate some embodiments of the present disclosure, and those ordinarily skilled in the art may obtain other accompanying drawings according to these accompanying drawings on the premise of no creative work.

DETAILED DESCRIPTION OF THE EMBODIMENTS

Figure 1:
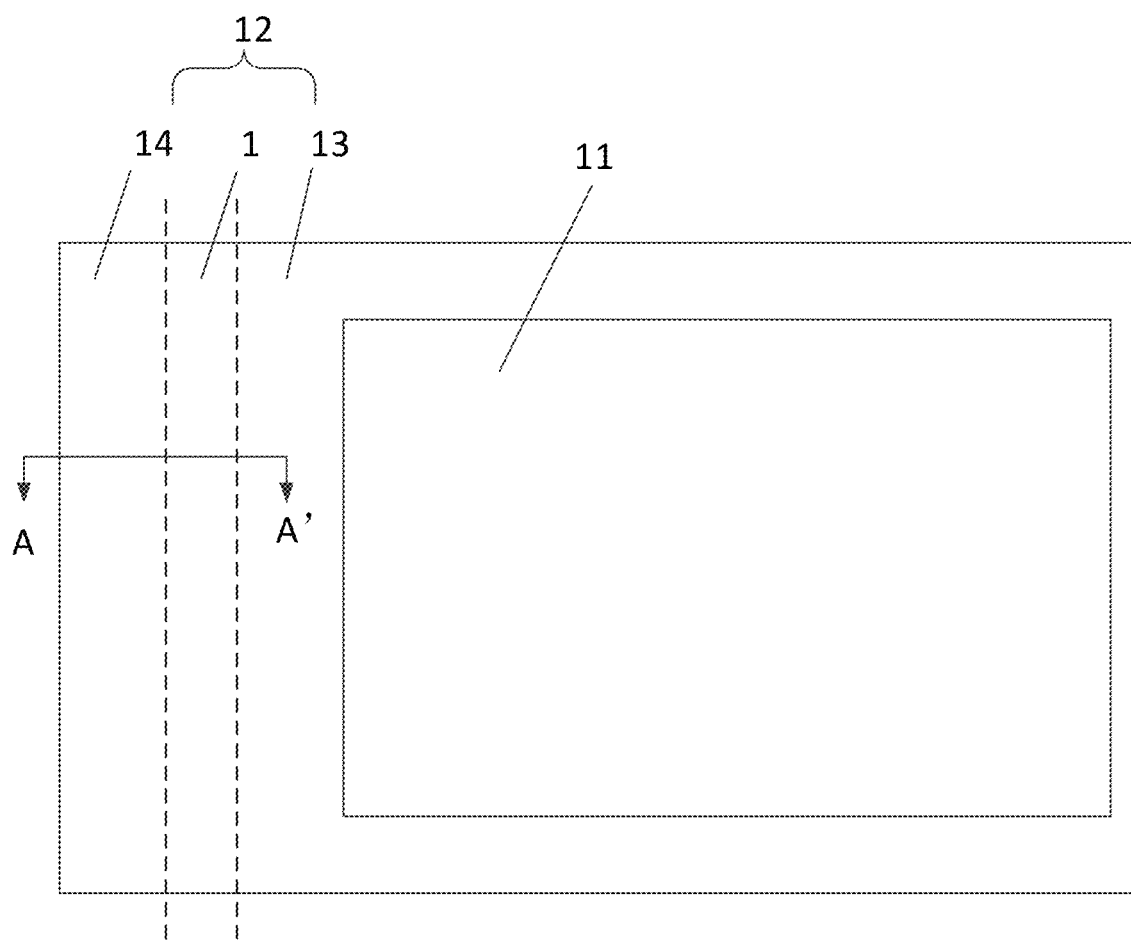
FIG. 1 is a schematic diagram of a display panel provided by an embodiment of the present disclosure.
Figure 2:
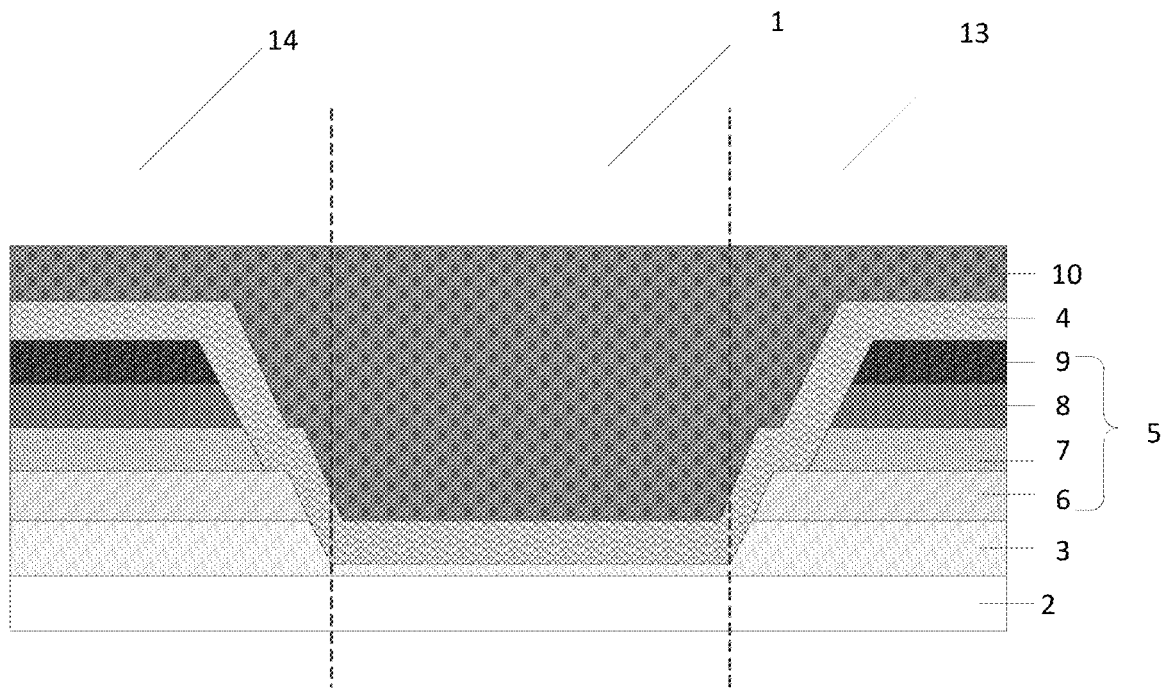
FIG. 2 is a sectional view along AA' of FIG. 1 provided by an embodiment of the present disclosure.

An embodiment of the present disclosure provides a display panel. As shown in FIG. 1 and FIG. 2, a sectional view along AA' of FIG. 1, the display panel has a display area 11 and a non-display area 12 outside the display area 11. The non-display area 12 includes: a first non-display area 13 close to the display area, a second non-display area 14 located on one side of the first non-display area 13 away from the display area 11, and a bent area 1 between the first non-display area 13 and the second non-display area 14. The bent area 1 includes: a substrate 2 and a first buffer layer 3 located on the substrate 2. Materials of the first buffer layer 3 include: a first doping element and a first insulation compound. The first doping element is used for improving ductility of the first buffer layer.

Figure 3:
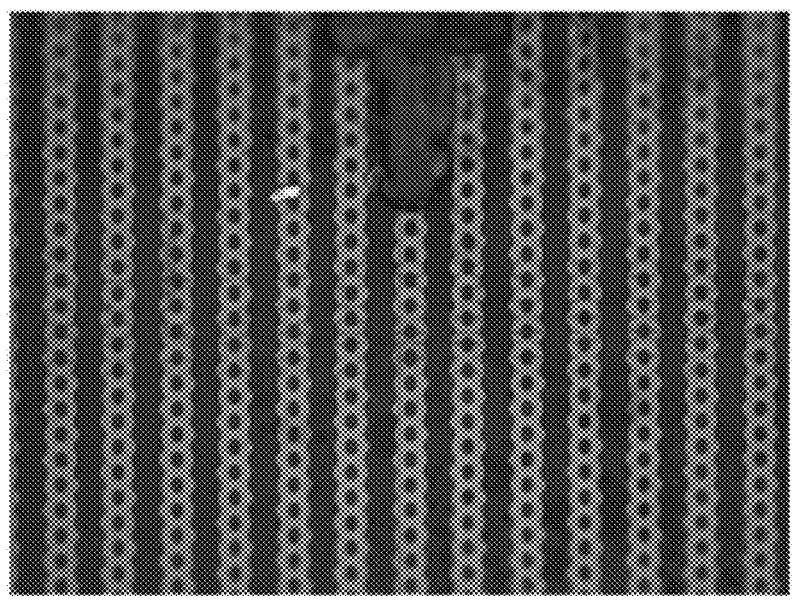
FIG. 3 is an electron microscopy diagram of breakage of a bent area provided by an embodiment of the present disclosure.
Figure 4:
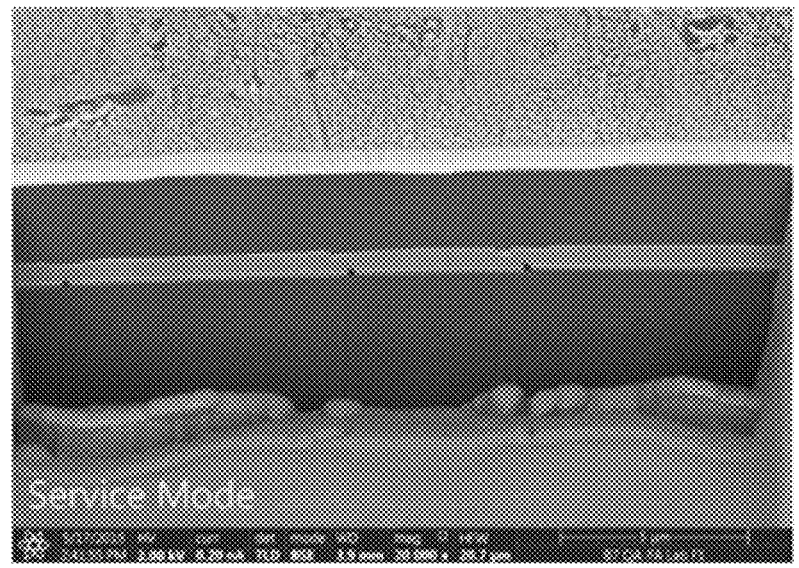
FIG. 4 is a FIB (focused ion beam) electron microscopy diagram of breakage of a bent area provided by an embodiment of the present disclosure.
Figure 5:
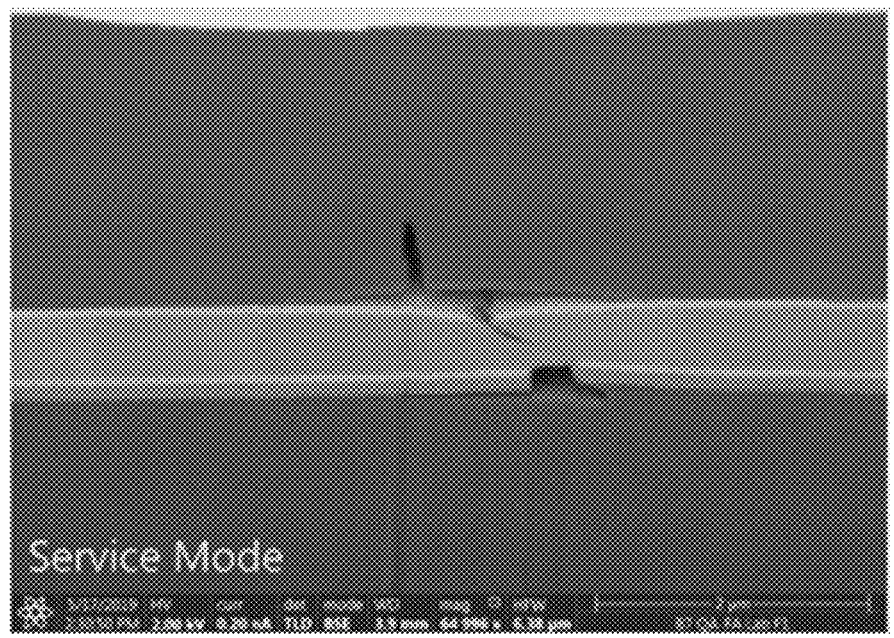
FIG. 5 is another FIB (focused ion beam) electron microscopy diagram of breakage of a bent area provided by an embodiment of the present disclosure.

It needs to be noted that a bent area of a flexible OLED display product in the prior art has an inorganic film, a metal lead layer of the bent area is located on the inorganic film, however, the metal lead layer on the inorganic film is prone to cracking, an electron microscopy diagram of the bent area is shown in FIG. 3, FIB electron microscopy diagrams are shown in FIG. 4 and FIG. 5, large-area breaking occurs to the inorganic film of the bent area, the metal lead layer in a breaking position of the inorganic film cracks, in the breaking position, a thickness of a residual inorganic film and a thickness of the metal lead layer are both normal, and thus it is extremely important to improve ductility of the inorganic film.

According to the display panel provided by an embodiment of the present disclosure, the materials of the first buffer layer include the first doping element so that the ductility of the first buffer layer can be improved, the first buffer layer can be prevented from breaking in a bending process, and a product yield can be improved.

It needs to be noted that FIG. 2 only shows a sectional structure of the non-display area of the display panel along AA' of FIG. 1. The display panel provided by an embodiment of the present disclosure may be an OLED display panel, for example. The display area of the display panel includes an OLED device and a pixel driving circuit.

Optionally, as shown in FIG. 2, the bent area 1 further includes a lead layer 4 located on the first buffer layer 3. The first buffer layer 3 and the lead layer 4 extend to the first non-display area 13 and the second non-display area 14. In the first non-display area 13 and the second non-display area 14, an insulation layer 5 is further arranged between the first buffer layer 3 and the lead layer 4. A thickness of the first buffer layer 3 in the first non-display area 13 and the second non-display area 14 is larger than that of the first buffer layer 3 in the bent area 1.

According to the display panel provided by an embodiment of the present disclosure, as the first doping element is doped in the first buffer layer, the ductility of the first buffer layer can be improved, the first buffer layer 3 is prevented from breaking in the bending process, then the lead layer 4 of the bent area can be prevented from cracking, thus a bright line cannot occur to the display panel, poor displaying can be avoided, and the product yield can be improved.

Optionally, as shown in FIG. 2, the insulation layer 5 may include, for example: a second buffer layer 6, a first gate insulation layer 7, a second gate insulation layer 8 and an interlayer insulation layer 9. As shown in FIG. 2, the display panel further includes a planarization layer 10 located on the lead layer 4. A pixel defining layer and a pad layer may be further arranged on the planarization layer.

Optionally, according to the display panel provided by an embodiment of the present disclosure, materials of the first insulation compound include silicon oxide ($SiO_x$).

Optionally, according to the display panel provided by an embodiment of the present disclosure, the substrate is a flexible substrate.

During actual implementation, a material of the substrate may be polyimide (PI), for example.

An element with many metallic bonds, for example, may serve as the first doping element.

Optionally, the first doping element includes one or combination of the following elements: a molybdenum (Mo) element, a zinc (Zn) element, a tin (Sn) element and a nickel (Ni) element.

Optionally, an atomic ratio of the first doping element in the first buffer layer is 5% to 6%.

Optionally, the materials of the first buffer layer further include a second doping element.

The second doping element is used for improving a thermal insulating property and a water-resisting property of the first buffer layer.

It needs to be noted that as for the flexible display panel, the flexible substrate needs to be arranged on a rigid base plate during manufacturing, manufacturing of subsequent films is performed in sequence, then the rigid base plate needs to be lifted off through a laser lift-off process, heat generated by the laser lift-off process is too high and possibly causes water vapor of a flexible material to pass through the first buffer layer and corrode the lead layer, and consequently displaying is poor.

According to the display panel provided by an embodiment of the present disclosure, the first buffer layer includes the second doping element, the thermal insulating property and the water-resisting property of the first buffer layer can be improved, thus the first buffer layer may serve as a laser lift-off stop layer during preparation of the display panel, the heat and the water vapor can be stopped better, the lead layer is further prevented from being corroded, thus poor displaying of the display panel can be further avoided, and the product yield is improved.

An element with a large thermal conductivity coefficient and a large hydrophobic contact angle, for example, may serve as the second doping element.

Optionally, the second doping element includes one or combination of the following elements: a germanium (Ge) element, a nickel (Ni) element and a zinc (Zn) element.

Optionally, an atomic ratio of the second doping element in the first buffer layer is 5% to 6%.

During actual implementation, Mo can be selected as the first doping element, and Ge can be selected as the second doping element. A small amount of Mo is doped and can be diffused through a crystal grain boundary so that the breaking strength and the ductility of the first buffer layer can be improved, and the first buffer layer can be prevented from breaking in the bending process. A thermal conductivity coefficient of Ge is 0.11 to 0.044 W/m·K, a hydrophobic contact angle of Ge is 117° to 140°, doping Ge in the first buffer layer can improve the thermal insulating property and the water-resisting property, the first buffer layer can serve as the laser lift-off stop layer in the laser lift-off process, and the lead layer is prevented from being corroded.

Figure 6:
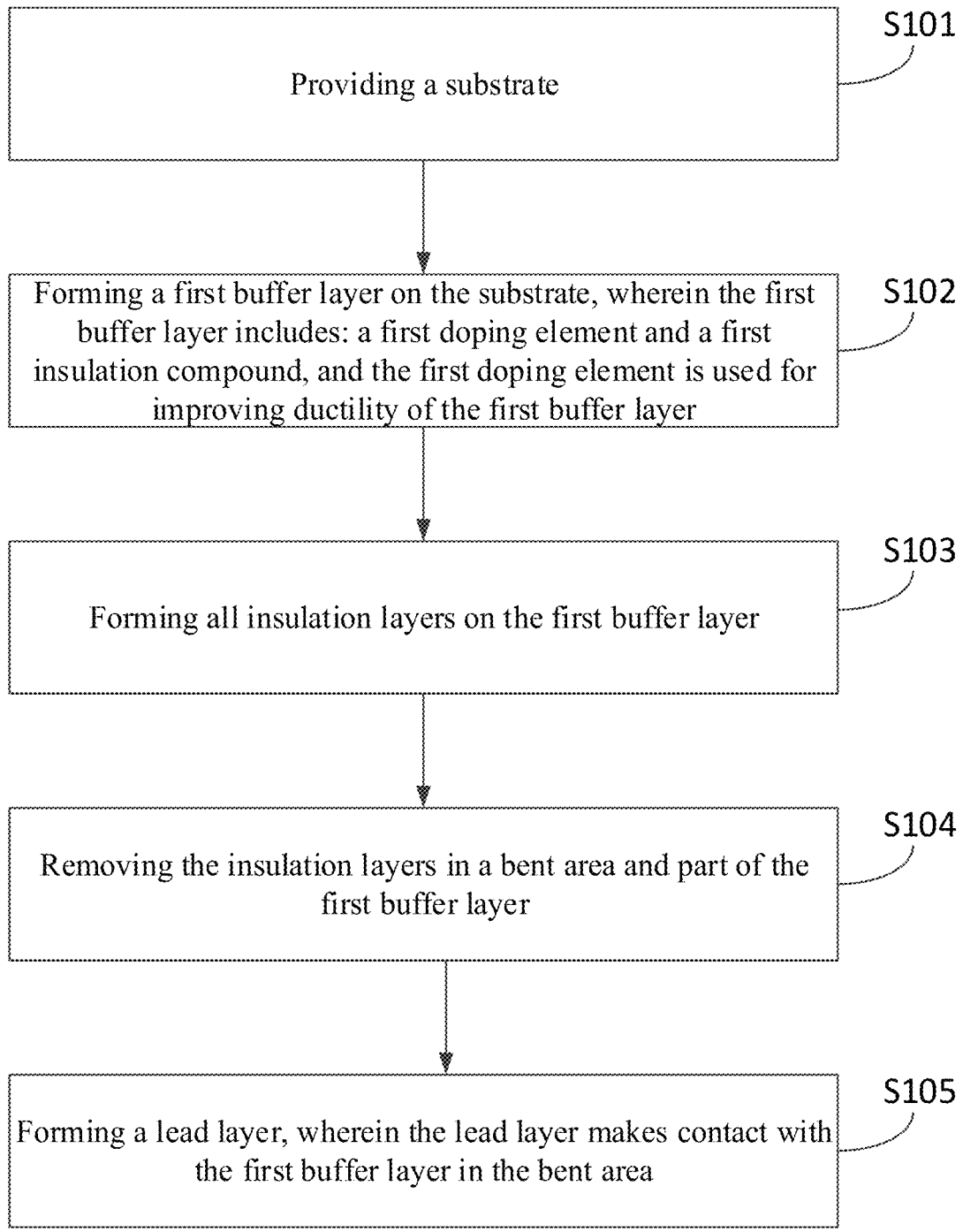
FIG. 6 is a schematic diagram of a preparation method of a display panel provided by an embodiment of the present disclosure.

An embodiment of the present disclosure provides a preparation method of a display panel, as shown in FIG. 6, including:

S101, a substrate is provided; the display panel includes a display area and a non-display area outside the display area, and the non-display area includes: a first non-display area close to the display area, a second non-display area located on one side of the first non-display area away from the display area, and a bent area between the first non-display area and the second non-display area;

S102, a first buffer layer is formed on the substrate; the first buffer layer includes: a first doping element and a first insulation compound, and the first doping element is used for improving ductility of the first buffer layer;

S103, all insulation layers are formed on the first buffer layer;

S104, the insulation layers in the bent area and part of the first buffer layer are removed;

S105, a lead layer is formed. The lead layer makes contact with the first buffer layer in the bent area.

According to the preparation method of the display panel provided by an embodiment of the present disclosure, the first doping element is doped in the first buffer layer, thus the ductility of the first buffer layer can be improved, the lead layer in the bent area can be prevented from cracking, a bright line cannot occur to the display panel, poor displaying can be avoided, and the product yield can be improved.

Optionally, providing the substrate includes:

a flexible substrate is formed on a rigid base plate.

Forming the first buffer layer on the substrate includes: the first buffer layer is formed on one side facing away from the rigid base plate, of the flexible substrate.

After the lead layer is formed, the method further includes: the rigid base plate is lifted off through a laser lift-off process.

Optionally, forming all the insulation layers on the first buffer layer includes: a second buffer layer, a first gate insulation layer, a second gate insulation layer and an interlayer insulation layer are formed on the first buffer layer in sequence.

Optionally, after the lead layer is formed and before the rigid base plate is lifted off through the laser lift-off process, the method further includes: a planarization layer, a pixel defining layer and a pad layer are formed on the lead layer in sequence.

Optionally, the first buffer layer further includes a second doping element, and forming the first buffer layer on the substrate includes:

a target material including the first doping element, the second doping element and the first insulation compound is provided; the second doping element is used for improving the thermal insulation property and the water-resisting property of the first buffer layer.

The target material is deposited on the substrate through a physical deposition process to form the first buffer layer.

According to the preparation method of the display panel provided by an embodiment of the present disclosure, as the first buffer layer further includes the second doping element, the thermal insulation property and the water-resisting property of the first buffer layer can be improved, the first buffer layer can serve as a laser lift-off stop layer during preparation of the display panel, heat and water vapor can be stopped better, the lead layer is further prevented from being corroded, poor displaying of the display panel can be further avoided, and the product yield is improved.

During actual implementation, the target material may be deposited on the substrate through a physical sputtering process.

During actual implementation, the target material of the first insulation compound with the first doping element and the second doping element doped therein may be provided. Certainly, a first doping element target material, a second doping element target material and a first insulation compound target material may be provided, a ratio of each of the target materials may be regulated accurately through sputtering equipment, and the target materials are deposited on the substrate through the sputtering process to form the first buffer layer.

Figure 7:
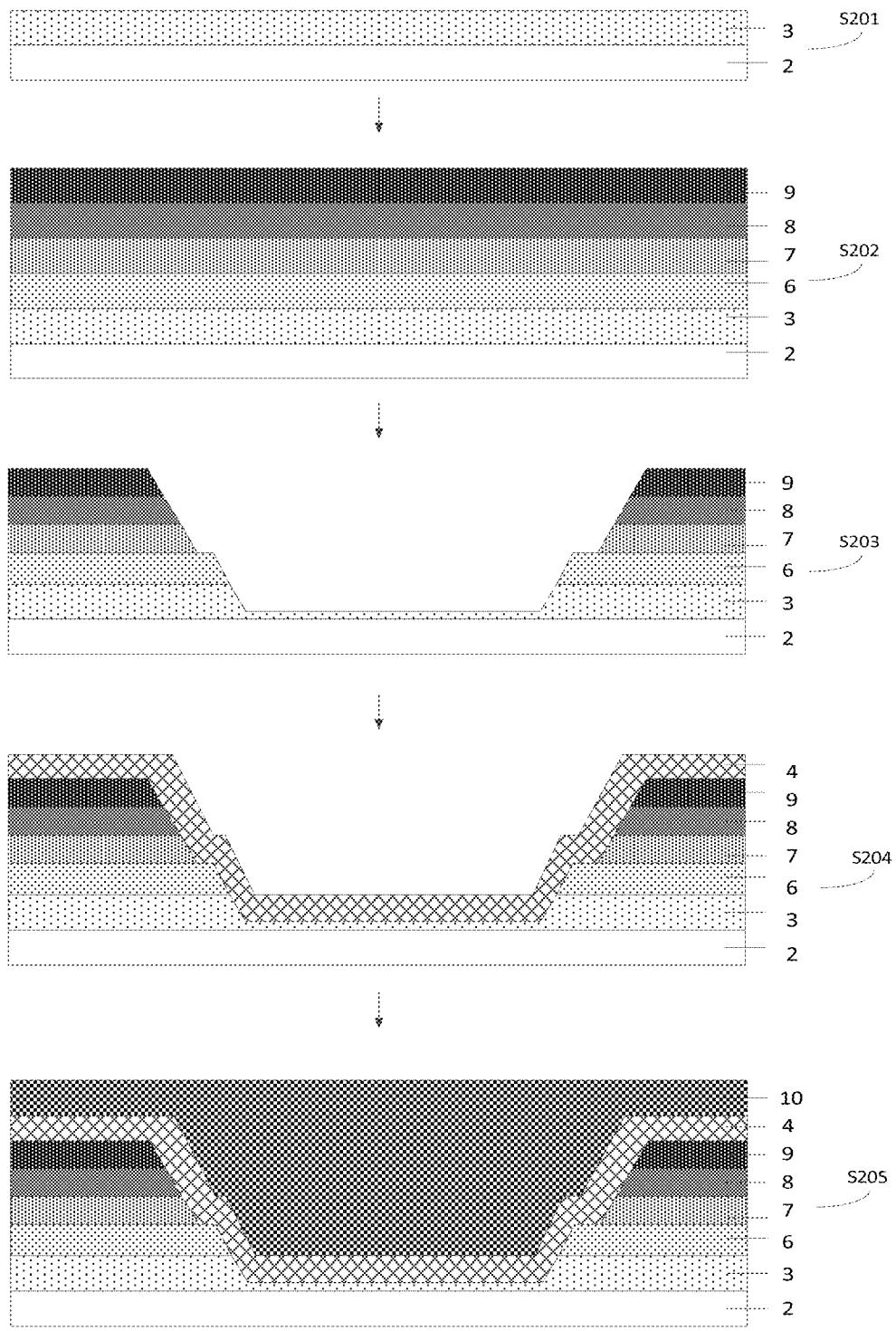
FIG. 7 is a schematic flow diagram of a preparation method of another display panel provided by an embodiment of the present disclosure.

Then, the preparation method of the display panel provided by the embodiment of the present disclosure is illustrated with Mo as the first doping element and Ge as the second doping element. As shown in FIG. 7, the preparation method of the display panel includes the following steps.

S201, the target material including the first doping element, the second doping element and the first insulation compound is deposited on the flexible substrate 2 to form the first buffer layer 3.

A thickness of the first buffer layer may be, for example, 5,500 Å.

S202, the second buffer layer 6, the first gate insulation layer 7, the second gate insulation layer 8 and the interlayer insulation layer 9 are formed on the first buffer layer 3 in sequence.

A thickness of the second buffer layer may be, for example, 4,000 Å, a thickness of the first gate insulation layer may be, for example, 1,200 Å, a thickness of the second gate insulation layer may be, for example 1,300 Å, and a thickness of the interlayer insulation layer may be, for example, 5,000 Å.

S203, the second buffer layer 6, the first gate insulation layer 7, the second gate insulation layer 8 and the interlayer insulation layer 9 in the bent area, and part of the first buffer layer 3 are removed.

A thickness of the first buffer layer 3 in the first non-display area and the second non-display area is larger than that of the first buffer layer 3 in the bent area.

S204, the lead layer 4 is formed.

A thickness of the lead layer may be, for example, 6,300 Å.

S205, the planarization layer 10 is formed on the lead layer 4.

In the first non-display area and the second non-display area, a thickness of the planarization layer may be, for example, 15,000 Å.

Step S205 may further include forming the pixel defining layer and the pad layer on the planarization layer, and a thickness of the pixel defining layer and the pad layer may be, for example, 25,000 Å.

An embodiment of the present disclosure provides a display device, including the display panel provided by embodiments of the present disclosure.

The display device provided by an embodiment of the present disclosure may be, for example, a mobile phone, a computer, a television and other devices.

To sum up, according to the display panel, the preparation method thereof and the display device provided by the embodiments of the present disclosure, as the materials of the first buffer layer include the first doping element, the ductility of the first buffer layer can be improved, the first buffer layer is prevented from breaking in the bending process, and the product yield is improved.

Obviously, those skilled in the art can make various changes and transformations without departing from the spirit and the scope of the present disclosure. In this case, if these changes and transformations of the present disclosure fall in the scope of claims and the equivalent art thereof, the present disclosure intends to include these changes and transformations.

What is claimed is:

1. A display panel, comprising a display area and a non-display area outside the display area, wherein the non-display area comprises: a first non-display area close to the display area, a second non-display area located on one side away from the display area, of the first non-display area, and a bent area between the first non-display area and the second non-display area, the bent area comprises: a substrate and a first buffer layer located on the substrate, materials of the first buffer layer comprise: a first doping element and a first insulation compound, and the first doping element is used for improving ductility of the first buffer layer;

wherein an atomic ratio of the first doping element in the first buffer layer is 5% to 6%.

2. The display panel according to claim 1, wherein the first doping element comprises one or combination of following elements: a molybdenum element, a zinc element, a tin element and a nickel element.

3. The display panel according to claim 1, wherein the materials of the first buffer layer further comprise a second doping element; and the second doping element is used for improving a thermal insulation property and a water-resisting property of the first buffer layer.

4. The display panel according to claim 3, wherein the second doping element comprises one or combination of following elements: a germanium element, a nickel element and a zinc element.

5. The display panel according to claim 4, wherein an atomic ratio of the second doping element in the first buffer layer is 5% to 6%.

6. The display panel according to claim 1, wherein the bent area further comprises a lead layer located on the first buffer layer; the first buffer layer and the lead layer extend to the first non-display area and the second non-display area; in the first non-display area and the second non-display area, an insulation layer is further arranged between the first buffer layer and the lead layer; and a thickness of the first buffer layer in the first non-display area and the second non-display area is larger than a thickness of the first buffer layer in the bent area.

7. A preparation method of a display panel, comprising:
providing a substrate, wherein the display panel comprises a display area and a non-display area outside the display area, the non-display area comprises a first non-display area close to the display area, a second non-display area located on one side area away from the display area, of the first non-display, and a bent area between the first non-display area and the second non-display area;
forming a first buffer layer on the substrate, wherein the first buffer layer comprises: a first doping element and a first insulation compound, and the first doping element is used for improving ductility of the first buffer layer; wherein an atomic ratio of the first doping element in the first buffer layer is 5% to 6%
forming an insulation layer on the first buffer layer;
removing the insulation layer in the bent area and a part of the first buffer layer; and
forming a lead layer, wherein the lead layer makes contact with the first buffer layer in the bent area.

8. The method according to claim 7, wherein the first buffer layer further comprises a second doping element, and the forming the first buffer layer on the substrate comprises:
providing a target material comprising the first doping element, the second doping element and the first insulation compound, wherein the second doping element is used for improving a thermal insulation property and a water-resisting property of the first buffer layer; and
depositing the target material on the substrate through a physical deposition process to form the first buffer layer.

9. The method according to claim 7, wherein the forming the insulation layer on the first buffer layer comprises:
forming a second buffer layer, a first gate insulation layer, a second gate insulation layer and an interlayer insulation layer on the first buffer layer in sequence.

10. A display device, comprising a display panel, wherein the display panel comprises: a display area and a non-display area outside the display area, the non-display area comprises: a first non-display area close to the display area, a second non-display area located on one side away from the display area, of the first non-display, and a bent area between the first non-display area and the second non-display area, the bent area comprises: a substrate and a first buffer layer located on the substrate, materials of the first buffer layer comprise: a first doping element and a first insulation compound, and the first doping element is used for improving ductility of the first buffer layer;

wherein an atomic ratio of the first doping element in the first buffer layer is 5% to 6%.

11. The display device according to claim 10, wherein the first doping element comprises one or combination of following elements: a molybdenum element, a zinc element, a tin element and a nickel element.

12. The display device according to claim 10, wherein the materials of the first buffer layer further comprise a second doping element; and the second doping element is used for improving a thermal insulation property and a water-resisting property of the first buffer layer.

13. The display device according to claim 12, wherein the second doping element comprises one or combination of following elements: a germanium element, a nickel element and a zinc element.

14. The display device according to claim 13, wherein an atomic ratio of the second doping element in the first buffer layer is 5% to 6%.

15. The display device according to claim 10, wherein the bent area further comprises a lead layer located on the first buffer layer; the first buffer layer and the lead layer extend to the first non-display area and the second non-display area; in the first non-display area and the second non-display area, an insulation layer is further arranged between the first buffer layer and the lead layer; a thickness of the first buffer layer in the first non-display area and the second non-display area is larger than that of the first buffer layer in the bent area.

* * * * *